United States Patent
Kreuzmayr

(10) Patent No.: US 12,030,228 B2
(45) Date of Patent: Jul. 9, 2024

(54) SEMI-FINISHED PRODUCT AND METHOD FOR PRODUCING A SEMI-FINISHED PRODUCT COMPRISING AT LEAST ONE MICROCOMPONENT

(71) Applicant: BETA Beratungs- und Beteiligungs-GmbH, Linz (AT)

(72) Inventor: Dominik Kreuzmayr, Bad Schallerbach (AT)

(73) Assignee: BETA Beratungs- und Beteiligungs-GmbH, Linz (AT)

( * ) Notice: Subject to any disclaimer, the term of this patent is extended or adjusted under 35 U.S.C. 154(b) by 1209 days.

(21) Appl. No.: 16/604,819

(22) PCT Filed: Apr. 11, 2018

(86) PCT No.: PCT/EP2018/059339
§ 371 (c)(1),
(2) Date: Nov. 15, 2019

(87) PCT Pub. No.: WO2018/189270
PCT Pub. Date: Oct. 18, 2018

(65) Prior Publication Data
US 2020/0164554 A1    May 28, 2020

(30) Foreign Application Priority Data

Apr. 11, 2017 (EP) .................... 17166126

(51) Int. Cl.
*B29C 45/00* (2006.01)
*B29C 45/14* (2006.01)
(Continued)

(52) U.S. Cl.
CPC .......... *B29C 45/0053* (2013.01); *B29C 45/14* (2013.01); *B81C 99/0085* (2013.01);
(Continued)

(58) Field of Classification Search
CPC .. B32B 3/02; B32B 3/30; B32B 27/08; B32B 2457/00; B29C 45/0053; B29C 45/14;
(Continued)

(56) References Cited

U.S. PATENT DOCUMENTS

| 7,201,863 B1* | 4/2007 | Ehrfeld ................... B29C 45/16 264/250 |
| 2003/0157751 A1* | 8/2003 | Ehrfeld ................. B23P 19/001 264/272.17 |
| 2004/0097650 A1* | 5/2004 | Ogawa .................... C08L 23/10 428/319.3 |

FOREIGN PATENT DOCUMENTS

| DE | 19850046 A1 | 5/2000 |
| DE | 10003999 A1 | 8/2001 |

(Continued)

OTHER PUBLICATIONS

K. Grossalber, "Klein, Kleiner, Mikro," Plastverarbeiter, Heuthig GmbH, Jan. 1, 2013, pp. 22-25, No. 1, Heidelberg, DE.

*Primary Examiner* — Maria V Ewald
*Assistant Examiner* — Ethan Weydemeyer

(57) ABSTRACT

A semi-finished product and a method for manufacturing a semi-finished product having at least one micro-component, which method uses a multi-component injection molding process, are disclosed, in which at least one mold chamber of an injection mold is provided with at least one lost part made of a first material, more particularly an injection-molded plastic material, and in another step for producing the micro-component, a second material, which is different from the first material and is elastomer-based, more particularly silicone-based, is injected, as a result of which a firm and form-fitting connection forms between the micro-component and the lost part. In order to be able to achieve advantageous cycle times in a risk-free way, it is proposed for the lost part to be embodied as a macroscopic object (Continued)

holder for the micro-component to permit manipulation of the semi-finished product and for the mold chamber to be provided with this lost part.

21 Claims, 3 Drawing Sheets

(51) Int. Cl.
*B81C 99/00* (2010.01)
*G06K 19/07* (2006.01)
*B29K 83/00* (2006.01)
*B29L 31/00* (2006.01)
*B32B 3/02* (2006.01)
*B32B 3/30* (2006.01)
*B32B 27/08* (2006.01)

(52) U.S. Cl.
CPC .. *G06K 19/0723* (2013.01); *B29C 2045/0094* (2013.01); *B29K 2083/00* (2013.01); *B29L 2031/756* (2013.01); *B32B 3/02* (2013.01); *B32B 3/30* (2013.01); *B32B 27/08* (2013.01); *B32B 2457/00* (2013.01)

(58) Field of Classification Search
CPC ...... B29C 2045/0094; B29L 2031/756; G06K 19/0723; B81C 99/0085
See application file for complete search history.

(56) References Cited

FOREIGN PATENT DOCUMENTS

| | | |
|---|---|---|
| DE | 102011102571 A1 | 11/2012 |
| WO | 9839230 A1 | 9/1998 |
| WO | 0076740 A1 | 12/2000 |
| WO | 2016155760 A1 | 10/2016 |

\* cited by examiner

SEMI-FINISHED PRODUCT AND METHOD FOR PRODUCING A SEMI-FINISHED PRODUCT COMPRISING AT LEAST ONE MICROCOMPONENT

FIELD OF THE INVENTION

The invention relates to a semi-finished product and to a method for manufacturing a semi-finished product having at least one micro-component using a multi-component injection molding process in which at least one mold chamber of an injection mold is provided with at least one lost part made of a first material, more particularly an injection-molded plastic material, and in another step for producing the micro-component, a second material, which is different from the first material and is elastomer-based, more particularly silicone-based, is injected, as a result of which a firm and form-fitting connection forms between the micro-component and the lost part.

BACKGROUND OF THE INVENTION

In order to produce multi-component macro-components, which consist of two different plastics, it is known (DE102011102571A1) to use a two-component injection molding process. In this process, a part that is inserted into a cavity of an injection mold is partially overmolded with another material. In this case, the other material forms a firm, form-fitting connection with the inserted part, which results in a semi-finished product from which finished multi-component macro-components can be broken by means of predetermined breaking points. The overmolded part serves both as part of the multi-component macro-components and as an object holder for the macro-components.

From the technical field of micro-injection molding, which is used to produce extremely small components in the weight range of less than one milligram, it is known (DE19850046A1) to produce hollow structures with the aid of a loose core, lost core, or lost part. For this purpose, the lost part is overmolded using a two-component injection molding process as a result of which a firm and form-fitting connection forms between them. Then the lost part is detached in order to remove it from the semi-finished product and thus arrive at the micro-component. An extremely wide variety of materials for the micro-component and for the lost part are known in the prior art. Despite the injection molding-related difficulties in this technical field of multi-component micro-injection molding, the operation of the known manipulators used to manipulate the micro-components produced therewith, for example robots and picker arms, poses increasing challenges in order to be able to precisely grasp, hold, position, or manipulate these components. An often time-consuming fine positioning of the manipulators and also a fine manipulation of such micro-components is to be expected, which can result in both long cycle times and damage to the micro-component.

SUMMARY OF THE INVENTION

Based on the prior art described at the beginning, the object of the invention, therefore, is to modify a method for manufacturing a semi-finished product having at least one micro-component in such a way that despite the extremely small dimensions of the injection molded semi-finished product, short cycle times can be achieved without risk.

The invention attains the stated object with regard to the method in that the lost part that is provided for the mold chamber of the injection mold is embodied as a macroscopic object holder for the micro-component to permit manipulation of the semi-finished product and the mold chamber is provided with this lost part.

If the lost part that is provided for the mold chamber of the injection mold is embodied as a macroscopic object holder for the micro-component and the mold chamber is provided with this lost part, then in the first place, the manipulation of the micro-component can be facilitated because a manipulator, which possibly used, does not have to grasp the micro-component, but can instead grasp the comparatively larger and/or heavier object holder. It is thus possible to avoid a time-consuming fine positioning of the manipulator, which can significantly reduce the cycle time of the method according to the invention. It is also possible to thus reduce the danger of an incorrect manipulation of the semi-finished product by the manipulator, which can further increase the reproducibility of the method according to the invention. In the second place, this manipulation of the semi-finished product by means of the lost part can also shield the micro-component from detrimental manipulation effects, especially since it is the nature of the lost part to be completely separated from the micro-component. Scratches or other material damage on the lost part thus cannot negatively affect the reproducibility of the method, which can be beneficial to the economy of the method. The method according to the invention can therefore be carried out not only quickly but also in an extremely reproducible way, which can be utilized to reduce costs. For this purpose, the lost part can be manufactured by means of an injection molding process out of a plastic material, more particularly a thermoplastic, in order to achieve the required macroscopic properties with regard to the object holder.

The manipulation of the semi-finished product can be facilitated if on the lost part, at least one manipulating surface is embodied on the outside of the semi-finished product, which is left accessible by the micro-component. This can also improve the secure and quick grasping of the semi-finished product by the manipulator and thus further facilitate execution of the method.

The reproducibility of the method can be improved further if, in order to form the connection between the micro-component and the lost part during the multi-component injection molding process, the second material is injected through at least one opening on the lost part. By means of this opening in the lost part, it is namely possible for the micro-component to be reliably held by its neck section, which can ensure a damage-free manipulation of comparatively slim micro-components.

The semi-finished product can be prepared for the removal of the lost part in that a predetermined breaking point is embodied in the lost part. Preferably, this is embodied before the injection molding of the second elastomer-based material into the mold chamber of the injection mold. In addition, the separation of the lost part and by extension, the detachment of the form-fitting connection can occur along predetermined paths in order to avoid damage to the micro-component.

If in addition, this predetermined breaking point is embodied as extending toward the form-fitting connection, then during removal of the lost part, the danger of damage to the micro-component can be further reduced, preferably if the predetermined breaking point is embodied as extending toward the opening. In addition, it is thus possible to ensure a reliable separation of the form-fitting connection between the opening of the lost part and the micro-component; a predetermined breaking point extending in this way also cannot be expected to impair the manipulation of the semi-finished product. This can be improved if the predetermined breaking point ends before the opening.

Shorter cycle times in the method can also be achieved if the lost part is produced from a plastic material by means of an injection molding process. In particular, it is thus possible to produce a predetermined breaking point in the lost part. Other optimizations can be achieved if the lost part is produced in a cavity of the injection mold for the multi-component injection molding process and by means of an index plate, is inserted, for example rotated, into the mold chamber for the multi-component injection molding process. This indexing method can conceivably be associated with other methods such as transfer technology with machines arranged parallel to each other.

The firm, form-fitting connection between the lost part and the micro-component can be embodied in a reproducible way if during the multi-component injection molding process, the lost part forms at least one undercut on the micro-component. This can be further improved if this forms a hidden undercut on the micro-component. Such an undercut can, for example, be produced by means of an overhang on the lost part. In addition, this undercut does not pose an obstacle to the method, not even when the lost part is separated from the micro-component. Particularly in this case, the undercut in the micro-component is accessible and the manipulation can be facilitated. The resulting assembly recess can specifically be matched to a possible assembly tool.

In general, it should be noted that because of the facilitated manipulability of the semi-finished product, the method can also be used to apply a medicinal substance to the semi-finished product. This can take place, for example, by means of spraying, roller-coating, or the like. It is thus also possible to ensure that the micro-component carries this substance even if the lost part is detached from the micro-component. It is also conceivable to add this substance—for example with an antibacterial action, etc.—to the elastomer base of the micro-component.

The above-described method can particularly feature the fact that it is used in the manufacture of a micro-component. In this case, in order to release the micro-component from the semi-finished product, the lost part is removed from the semi-finished product. In particular, a separation of the lost part from the semi-finished product can enable a rapid removal of the lost part from the micro-component. The reproducibility of this separation can be further increased if the lost part is broken off along its predetermined breaking point on the lost part in order to release the micro-component from the semi-finished product.

Based on the above-explained prior art, another object of the invention is to create a semi-finished product with a lost part and a micro-component, which, despite extremely small dimensions of the micro-component, can be manipulated simply and reliably by a manipulator. In addition, this makes it possible to achieve a durable semi-finished product.

The invention attains the stated object with regard to the semi-finished product in that the lost part is embodied as a macroscopic object holder for the micro-component to permit manipulation of the semi-finished product.

If the lost part is embodied as a macroscopic object holder for the micro-component, then mechanical stresses can be conveyed away by the object holder, which is larger and/or more massive than the micro-component. It is thus possible to significantly increase the durability of the semi-finished product. In addition, the micro-component can be freed of stresses due to a manipulator because the object holder can be used for manipulating the semi-finished product, which can protect even a delicate micro-component from damage and thus significantly improve the semi-finished product according to the invention.

If the lost part forms at least one manipulating surface on the outside of the semi-finished product, which is left accessible by the micro-component, then even damage in the vicinity of the manipulation surface cannot result in damage to the micro-component. The lost part is especially intended for removal from the micro-component and is thus not a part of the micro-component. Furthermore, the manipulation of the semi-finished product by means of the manipulation surface, which is larger in area than the micro-component, can become simpler and more reliable.

In general, it should be noted that the removal of the lost part can take place through destruction of the non-detachable form-fitting connection between the semi-finished product and the micro-component.

If the lost part forms at least one positioning aid on the outside of the semi-finished product, which is left accessible by the micro-component, this can further facilitate the manipulation of the semi-finished product. Such a positioning aid can, for example, be formed by a notch or recess in the lost part.

If the lost part has an opening through which the micro-component protrudes to form the connection, then even slim micro-components can be durably connected to the lost part and fastened to the semi-finished product. Simplified manipulation conditions relative to the semi-finished product can be achieved if the lost part is embodied as plate-shaped.

The removal of the lost part can be further facilitated if the lost part has a predetermined breaking point by means of which the form-fitting connection between the micro-component and the lost part can be destroyed. This destruction can be completed without damage to the micro-component if the predetermined breaking point extends toward the form-fitting connection, more particularly the opening, and more particularly, ends before it.

The manipulation of the semi-finished product can thus be facilitated by embodying the lost part as plate-shaped. Preferably, using thermoplastic as the material for the lost part can satisfy the injection molding-related requirements and also ensure a sufficient strength for holding elastomer-based micro-components.

If the lost part has at least one overhang that forms an undercut, more particularly a hidden one, on the micro-component, then even slim micro-components can be durably secured to the lost part and fastened to the macroscopic object holder.

BRIEF DESCRIPTION OF THE DRAWINGS

The subject of the invention is shown by way of example in the drawings. In the drawings.

DETAILED DESCRIPTION OF THE PREFERRED EMBODIMENTS

Figure 1:
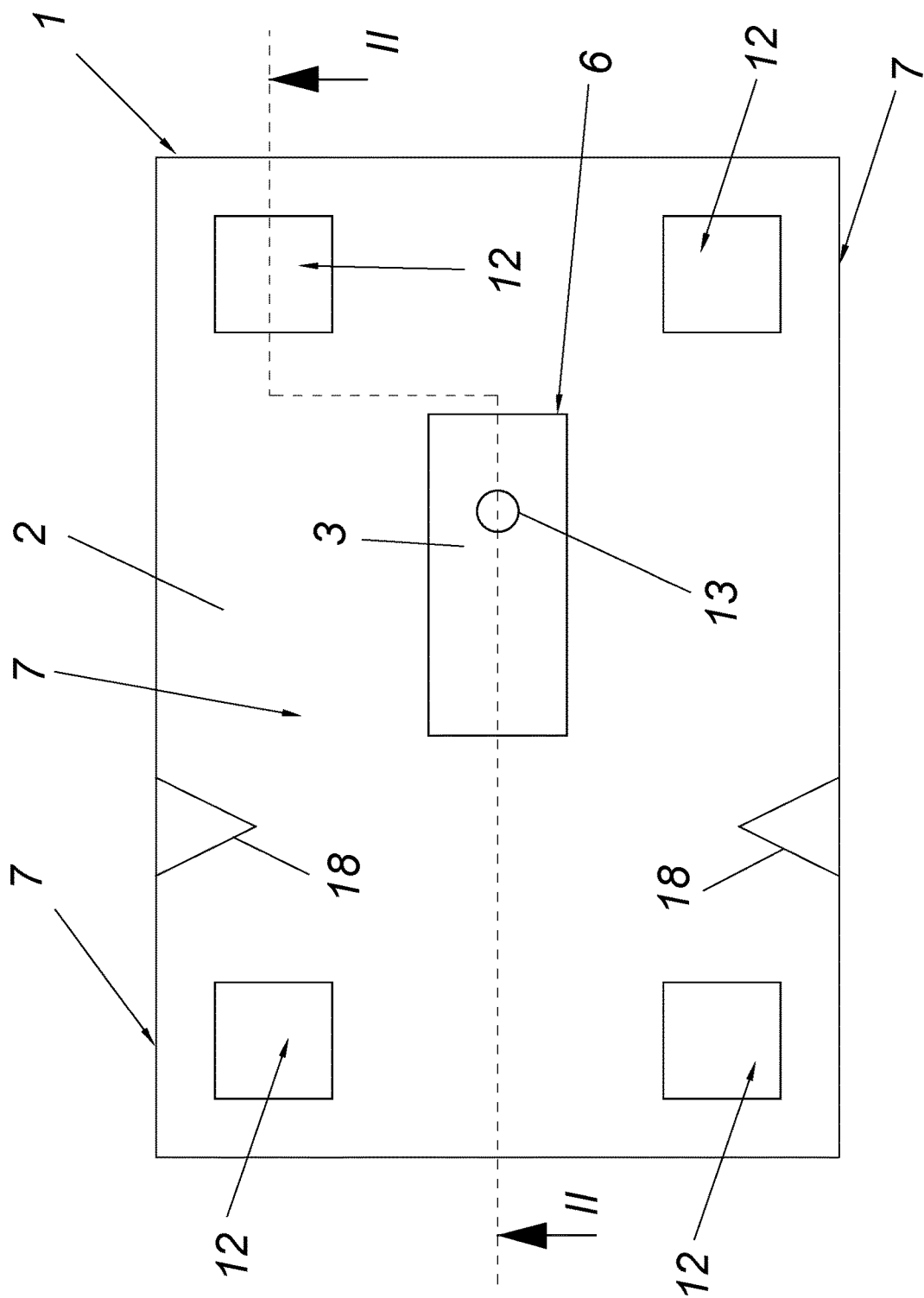
FIG. 1 shows a top view of a semi-finished product with a micro-component.
Figure 2:
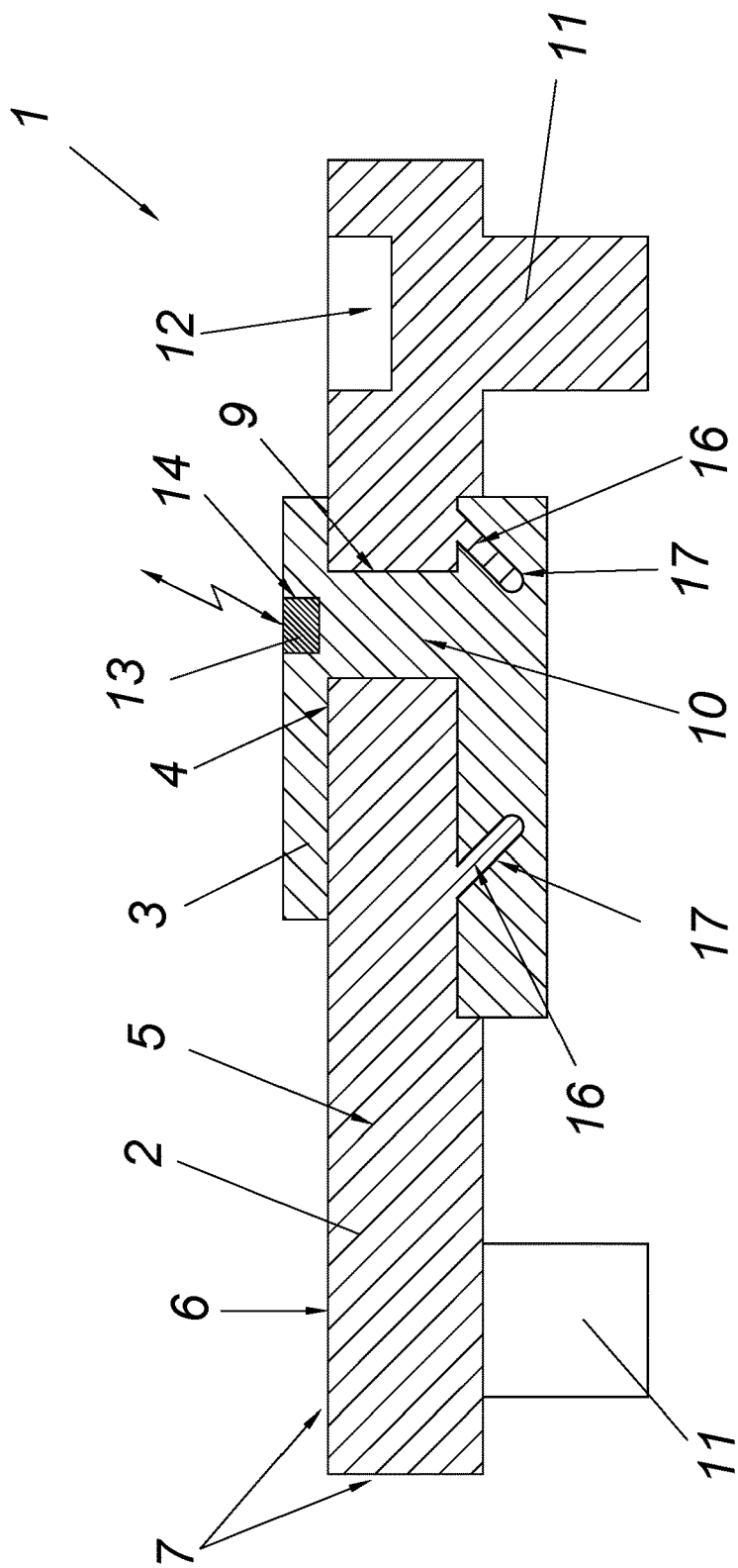
FIG. 2 shows a sectional view according to the line 11-11 in FIG. 1.
Figure 3:
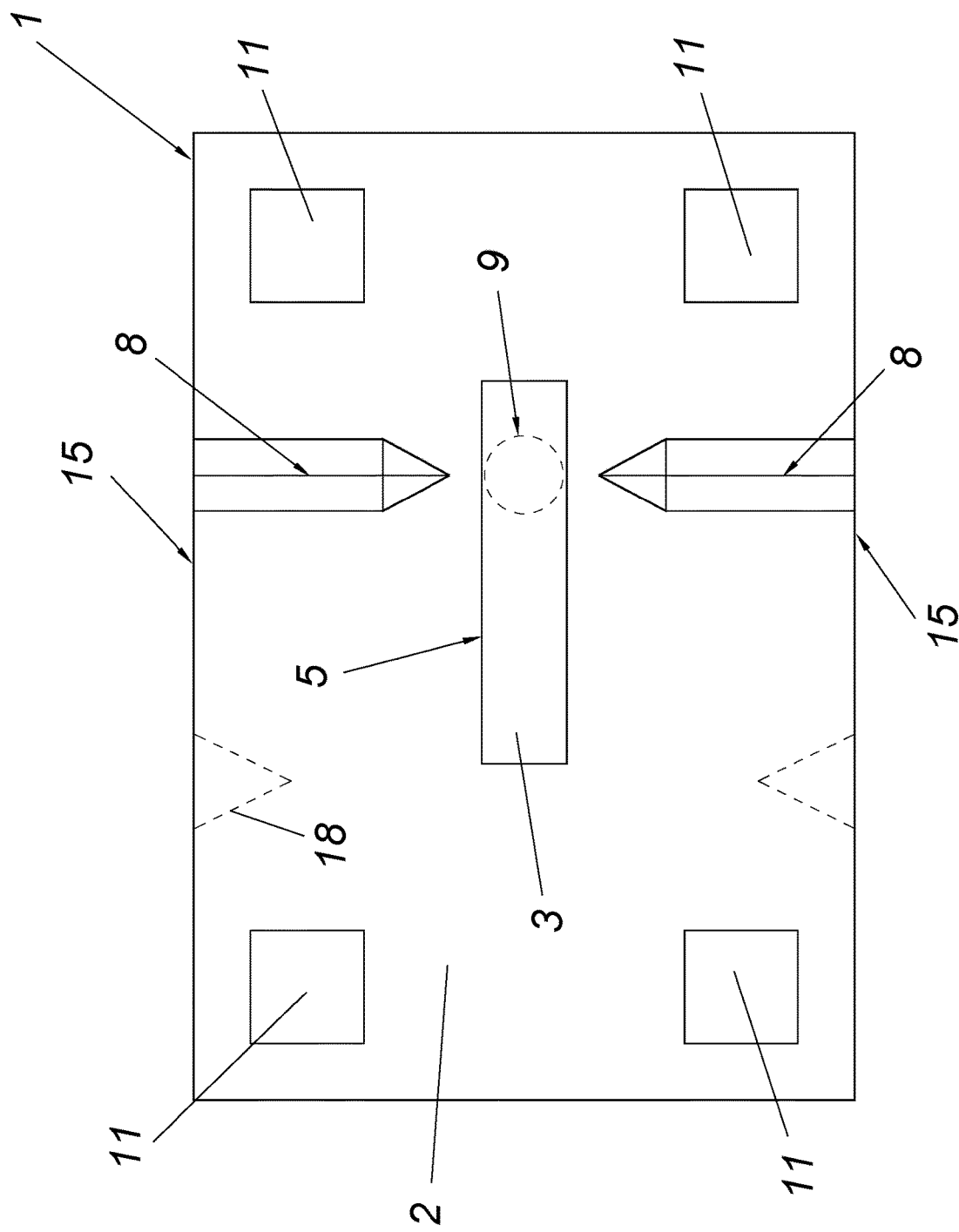
FIG. 3 shows a bottom view of FIG. 1.

For example, FIGS. 1 to 3 show the semi-finished product 1 according to the invention composed of a lost part 2 and a micro-component 3. The lost part 2 and the micro-component 3 of are made different materials—the lost part 2 consists of a thermoplastic and the micro-component 3 consists of silicone. Other materials are conceivable. The lost part 2 and the micro-component 3 are firmly connected to each other by a form-fitting connection 4. This connection 4 is particularly visible in FIG. 2. Preferably, this connection 4 is free of material bonding due to chemical interaction. The connection 4 is produced by using a multi-component injection molding process, which is known and not depicted in detail, in that the lost part 2 is provided in a mold chamber of an injection mold and then an elastomer-based material, namely silicone for example, is injected in order to thus produce the micro-component 3. By removing, for example destroying, the lost part 2, it is possible to eliminate this firm, form-fitting connection 4, thus separating the micro-component 3 from the semi-finished product 1. In general, it should be noted that the firm and form-fitting connection 4 can be permanent or non-detachable.

By contrast with known semi-finished products, with micro-components, the lost part 2 according to the invention serves not only to form contours on the micro-component 3, but also assumes the function of a macroscopic object holder 5 for the micro-component 3. The selection of a macroscopic object holder 5 also simplifies an automated manipulation of the micro-component 3—in addition, its risk of being damaged by manipulators that are not shown is also particularly reduced. The latter is especially also due to the fact that the lost part 2 forms a manipulation surface 7 for the manipulator on the outside 6 of the semi-finished product 1, which surface is left accessible by the micro-component 3. To be precise, a manipulator for manipulating the semi-finished product 1 can avoid contact surfaces on the micro-component 3; the lost part 2 can be used to supply the carried micro-component 3 and the semi-finished product 1 to manipulation tasks, positioning tasks, and/or measuring tasks. Among other things, the manipulator holds the micro-component 3 in a stress-free way as the latter is being positioned.

As is apparent from FIGS. 1 to 3, this manipulation surface 7 on the outside 6 of the semi-finished product 1 is significantly larger in area than the micro-component 3. Such a manipulation surface 7 can be manufactured in a simple way in terms of the process in that during the multi-component injection molding process, the lost part 2 remains correspondingly free of the second material. This can take place, for example, through the shape of the mold chamber of the injection mold and/or also upon ejection of the micro-component 3 from the injection mold by means of a tearing-off, a laser cutting, or another cutting method. In general, it should be noted that this manipulation surface 7 can be formed on any side of the lost part 2 that remains accessible by the micro-component 3 on the outside of the semi-finished product 1. This manipulation surface 7 can, for example, be used by picker arms, suction holders, etc., in order to manipulate the semi-finished product 1 for other steps.

The multi-component injection molding process according to the invention that is used to manufacture this micro-component can also be understood as a multi-component micro-injection molding process.

To this end, it should be noted in general that an injection molding of micro-components or micro-injection molding can basically be explained by means of the procedures used in the manufacture of macro-components. The differences primarily lie in the weight of the components. It is generally noted that the weight of micro-components can lie in the range of a few mg and preferably fewer than 10 mg, which can thus result in dimensions beginning in the μm range down to 0.1 μm. By contrast with this, the component weight and thus the size of macro-components is quite clearly larger than the μm range.

The removal of the lost part 2 or object holder is considerably easier if the lost part 2 has a predetermined breaking point 8, which is depicted in FIG. 3. This predetermined breaking point 8 also features the fact that it extends from the opposite ends 15 of the lost part 2 or semi-finished product 1 to an opening 9 in the lost part 2, which opening 9 contributes to the form-fitting connection 4, with the micro-component 3 or the neck 10 thereof protruding through it. If the lost part 2 breaks along this predetermined breaking point 8, this destroys the form-fitting connection 4 between the lost part 2 and the micro-component 3 and releases the micro-component 3 without damage. As is also apparent from FIG. 3, the predetermined breaking point 8 in the lost part 2 ends, tapering to a point before the opening in order to avoid reducing the strength of the semi-finished product 1 in the vicinity of the enclosed neck 10 of the micro-component 3, but nevertheless produce a reliable breaking line. It is also conceivable for the micro-component 3 to be pressed out from the lost part 2 or the object holder, which is quite possible with silicone components of this kind.

As can be inferred from FIG. 2, the semi-finished product 1 is flat and by extension plate-shaped. Adjustable feet 11 are injection molded onto the semi-finished product 1 in order to be able to cut the semi-finished product 1 off from the micro-component 3 in a non-damaging way. Foot recesses 12 on the top side of the semi-finished product enhance the stackability of the semi-finished products 1.

Due to the reproducible manipulation of the semi-finished product 1, the micro-component 3 is particularly suitable for use in electrical engineering in that the semi-finished product is provided with a passive RFID transponder 13. According to FIG. 2, this RFID transponder 13 is provided in a recess 14 of the micro-component 3. It is also conceivable to provide a medicinal substance 13 in this recess. All of this is reproducibly possible in that the manipulation surfaces 7 on the lost part 2 enable an exact positioning of the micro-component 3 by a manipulator.

In addition, the micro-component 3 on the one hand can be held in a particularly secure fashion by the lost part 2 and on the other hand, can be steadily held by a hand tool if multiple mounting recesses are provided on the micro-component 3. One of these mounting recesses is provided in the micro-component 3 in a simple way in terms of the process in that during the multi-component injection molding process, an overhang 16 on the lost part 2 forms a hidden undercut 17—hidden in that only after a removal of a part (for example the right half of the lost part 2 shown in FIG. 2) does this mounting recess become accessible and can thus be revealed. It therefore also becomes possible, after a partial removal of the lost part 2, to already hold and grasp the micro-component 3 before the lost part 2 is completely removed. This makes the manipulation of the micro-component 3 user-friendly. As shown with dashed lines in FIG. 2, it is also conceivable for two or more overhangs 16 to be provided on the lost part 2 in order, for example, to thus improve the cohesion of the semi-finished product 1.

As is also indicated particularly in FIG. 1, on the top side of the semi-finished product 1, namely on the lost part 2, two groove-shaped opposing recesses are provided, which serve as a positioning aid 18. The semi-finished product 1 can thus be oriented in a way that is easy for the manipulator by means of centering projections, not shown in detail, which can engage in this positioning aid 18. It is thus possible to further facilitate the manipulation of the semi-finished product 1.

In general, it should also be noted that it is possible to synthesize an elastomer base that is based on NBR (nitrile rubber), HNBR (hydrogenated nitrile rubber), FPM (fluoroelastomer), EPDM (ethylene propylene rubber with a third component), ECO (epichlorohydrin rubber), TPE (thermoplastic elastomers) with or without a release agent, HTV silicone (high temperature vulcanized silicone rubber), or also silicone in general.

The invention claimed is:

1. A semi-finished product produced by using a multi-component injection molding process, the semi-finished product comprising:
    a lost part;
    at least one micro-component made of a material that is different from a material of the lost part, wherein the micro-component material is elastomer-based; and
    a non-detachable, form-fitting connection between the at least one micro-component and the lost part, wherein the non-detachable, form-fitting connection prevents movement of the at least one micro-component in all directions;
    wherein the lost part is embodied as a macroscopic object holder for the at least one micro-component for manipulating the semi-finished product, and the lost part forms at least one manipulating surface on an outside of the semi-finished product, which is left accessible by the at least one micro-component, and the at least one micro-component is located at least partially on the outside of the semi-finished product.

2. The semi-finished product according to claim 1, wherein the lost part forms at least one positioning aid on an outside of the semi-finished product, which is left accessible by the at least one micro-component.

3. The semi-finished product according to claim 1, wherein the lost part has an opening through which the at least one micro-component protrudes to form the connection.

4. The semi-finished product according to claim 1, wherein the lost part has a predetermined breaking point for destroying the connection between the at least one micro-component and the lost part, and the predetermined breaking point extends from opposite ends of the lost part toward the non-detachable, form-fitting connection.

5. The semi-finished product according to claim 1, wherein the lost part, which is comprised of a thermoplastic, is embodied as plate-shaped.

6. The semi-finished product according to claim 1, wherein the lost part has at least one overhang that forms an undercut, on the at least one micro-component.

7. The semi-finished product according to claim 1, wherein the micro-component material is silicone-based.

8. The semi-finished product according to claim 4, wherein the predetermined breaking point extends toward an opening in the lost part through which the at least one micro-component protrudes to form the connection, and the predetermined breaking point ends before the opening.

9. The semi-finished product according to claim 4, wherein the predetermined breaking point tapers to a point before reaching the non-detachable, form-fitting connection.

10. The semi-finished product according to claim 1, wherein the at least one micro-component has a recess on the outside of the semi-finished product.

11. The semi-finished product according to claim 10, further comprising a medicinal substance in the recess.

12. A method for manufacturing the semi-finished product having at least one micro-component according to claim 9, the method comprising:
    using a multi-component injection molding process in which at least one mold chamber of an injection mold is provided with at least one lost part made of a first material, and
    in another step for producing the at least one micro-component, injecting a second material, which is different from the first material and is elastomer-based, as a result of which a firm and form-fitting connection forms between the at least one micro-component and the at least one lost part, wherein the at least one lost part is embodied as a macroscopic object holder for the at least one micro-component for manipulating the semi-finished product and the at least one mold chamber is provided with the at least one lost part.

13. The method according to claim 12, comprising forming the connection between the at least one micro-component and the at least one lost part during the multi-component injection molding process by injecting the second material through at least one opening in the at least one lost part.

14. The method according to claim 12, wherein the at least one lost part comprises a predetermined breaking point.

15. The method according to claim 14, wherein the predetermined breaking point is embodied as extending toward the form-fitting connection.

16. The method according to claim 12, wherein during the multi-component injection molding process, the at least one lost part forms at least one undercut, more particularly at least one hidden undercut, on the at least one micro-component.

17. The method according to claim 12, comprising removing the at least one lost part from the semi-finished product.

18. The manufacturing method according to claim 17, comprising separating the at least one lost part from the semi-finished product, more particularly by breaking off the at least one lost part from the semi-finished product at a predetermined breaking point in the at least one lost part.

19. The method according to claim 12, wherein the first material is an injection-molded plastic material.

20. The method according to claim 12, wherein the second material is silicone-based.

21. The method according to claim 14, wherein the predetermined breaking point is embodied as extending toward an opening in the at least one lost part through which the second material is injected during the multi-component injection molding process, and more particularly, is embodied as ending before the opening.

* * * * *

UNITED STATES PATENT AND TRADEMARK OFFICE
CERTIFICATE OF CORRECTION

| | |
|---|---|
| PATENT NO. | : 12,030,228 B2 |
| APPLICATION NO. | : 16/604819 |
| DATED | : July 9, 2024 |
| INVENTOR(S) | : Dominik Kreuzmayr |

Page 1 of 1

It is certified that error appears in the above-identified patent and that said Letters Patent is hereby corrected as shown below:

In the Claims

Claim 12, Line 2, please delete "according to claim 9" and insert -- according to claim 1 --.

Signed and Sealed this
Thirteenth Day of May, 2025

Coke Morgan Stewart
*Acting Director of the United States Patent and Trademark Office*